United States Patent

Oh et al.

[11] Patent Number: 6,031,876
[45] Date of Patent: Feb. 29, 2000

[54] TRELLIS DECODER FOR ATSC 8VSB

[75] Inventors: Dae-Il Oh, Kyoungki-do; Eung-Ryeol Kim, Seoul; Dae-Hyun Kim, Seoul; Won-Jin Lee, Seoul, all of Rep. of Korea

[73] Assignee: Hyundai Electronics Ind Co., Ltd., Kyoungki-do, Rep. of Korea

[21] Appl. No.: 08/882,668

[22] Filed: Jun. 25, 1997

[30] Foreign Application Priority Data

Jun. 29, 1996 [KR] Rep. of Korea ......................... 96 26006

[51] Int. Cl.[7] ................................................. H04L 5/12
[52] U.S. Cl. ........................ 375/265; 375/262; 375/341; 371/43.4
[58] Field of Search ................................ 375/265, 341, 375/262; 371/43.4, 43.7, 43.6

[56] References Cited

U.S. PATENT DOCUMENTS

| 5,446,746 | 8/1995 | Park | 371/43.7 |
| 5,841,819 | 11/1998 | Hu et al. | 375/341 |
| 5,859,861 | 1/1999 | Oh | 371/43.7 |
| 5,878,092 | 3/1999 | Choi | 375/341 |

*Primary Examiner*—Stephen Chin
*Assistant Examiner*—Shuwang Liu
*Attorney, Agent, or Firm*—McAulay Nissen Goldberg Kiel & Hand, LLP

[57] ABSTRACT

A traceback device of a trellis decoder including a memory for storing survivor path information as much as a decision depth, a multiplexing unit for decoding the survivor path information received from the memorizing unit, and a traceback unit receiving the survivor path information of lower bits decoded by the multiplexing unit and state output of itself, to carry out a state transition and trace back the decoded value of lower bits.

3 Claims, 7 Drawing Sheets

TRELLIS DECODER FOR ATSC 8VSB

BACKGROUND OF THE INVENTION

1. Field of the Invention

The present invention relates to a system for receiving the digital transmission standards such as DTV (Digital Television) mode and, more particularly to a traceback device off a trellis decoder for ATSC 8VSB (Vestigial Sideband) using the Viterbi decoding algorithm.

2. Discussion of Related Art

The error control and correction technique is generally utilized in the digital communications system to overcome the channel problems such as noise, fading effect and the like. The technique for minimizing errors includes: the channel encoding technique using a convolution encoder in the section of the transmitter, and the channel decoding technique with a Viterbi decoder in the section of the receiver.

FIG. 1 is a block diagram of a general convolution encoder. As shown in FIG. 1, the convolution encoder comprises a 2-bit shift transistor 11 and two adders 12 and 12' for executing modulo-two addition. Outputs G1 and G2 are determined according to the states contained in the shift register 11 and an input 13.

The outputs G1 and G2 are represented over time in the trellis diagram shown in FIG. 2. Referring to FIG. 2, each point indicates the state of the shift register 11. The branch of a solid line shows a transition when the input is '0', that of a dotted line a transition when the input is '1'. Numerals on the branches represent the outputs G1 and G2 when the transition takes place at the respective branches. When two paths combine with each other in the transition, the Viterbi decoder in the section of the receiver chooses a likely path between the two paths but truncates the other by means of the Viterbi decoding algorithm called 'maximum likelihood decoding'. The path selected is called a survivor path, containing information as much as a decision depth or truncation depth determined in each state. For example, the bold solid line in FIG. 2 is the survivor path in the state 1 (01) at the time unit 10.

Accordingly, the Viterbi algorithm decodes by choosing the most likely path between the two survivor paths in the respective states to carry out a traceback.

A trellis decoder based on the Viterbi algorithm, as shown in FIG. 3, comprises an input 21, a branch metric arithmetical unit 22 for carrying out all arithmetic and logic operations of the branch metric of the reference value at each branch in the trellis diagram, an ACS (Add-Compare-Select) arithmetical unit 23 for choosing one survivor path in each state and performing arithmetic and logic operations of the state metric of the survivor path, a normalization arithmetical unit 24 for subtracting a maximum likelihood value from the output of the ACS arithmetical unit 23, a state metric memory 25 for storing the state metric, a maximum likelihood value detection unit 26 for detecting one path having the most likely one out of the survivor paths in each state, a path memory 27 for storing information concerning the survivor paths in each state, and a traceback unit 28 for performing a traceback of the survivor path with the output of the maximum likelihood value detection unit 26.

The traceback unit 28, as shown in FIG. 4, comprises a path memory 31 for storing a survivor path as much as a decision depth, a multiplexer 32, a register 33, and a path memory controller 34. The size of the register 33 is equal to K(constraint)−1 and the size of the path memory 31 is $M(=2^{K-1})$ * (decision depth). An M-to-1 multiplexer is used for the multiplexer 32.

In the trellis decoder, the traceback unit as constructed above performs a traceback by using the survivor path information at each time unit.

For example, when $s_{mj}$ is the survivor path information in the state $m_j=a_jb_j$ at the time unit j, the previous state $m_{j-1}=a_{j-1}b_{j-1}$ at a time unit j−1, is given by $m_{j-1}=b_js_{mj}$ on the survivor path. As understood from the construction of the convolution encoder, $b_j=a_{j-1}$, $s_{mj}=b_{j-1}$. In a decoding process, the traceback unit detects a state having the minimum value at each time unit and determines the previous state from the survivor path information stored in the path memory. Such traceback process is repeated as a decision depth (hereinafter, referred to as 'L') and controlled by the path memory controller 34.

While the traceback unit can reduce the cost for hardware by using a single port RAM of M*L, it is adaptable only for the applications of a relatively low clock speed. Thus, the conventional traceback unit must be equipped with an additional control circuit as well as a memory of larger capacity in order to accomplish the traceback in one cycle of the clock.

Another example to overcome the problem as mentioned above is a pipe line type traceback unit as shown in FIG. 5, using the arithmetical device as much as the decision depth. It improves the operational speed of the Viterbi decoder but requires a relatively excessive cost for hardware.

FIG. 6 is a timing diagram of the symbol clock, input and symbol inputs of each trellis decoders to traceback through the conventional traceback unit. Referring to FIG. 6, the maximum decision depth L is limited to 11 because each of the trellis decoders has eleven symbol clocks between the symbol inputs.

The capacity of error control and correction of the trellis decoder depends on the decision depth L. It is thus required that the decision depth must be at least 16 to maintain the segment error rate below $3\times10^{-6}$ at SNR 14.9 db of GA 8VSB mode. When the decision depth is determined over 12 so as to carry out a traceback in the units of symbol clocks and improve the capacity of error control and correction, the next symbol input is transferred into the trellis decoder to perform another traceback before the previous traceback is completed. Thus a separate control circuit is required in addition to the need of a memory of larger capacity.

Since the transmitter of ATSC 8SVSB mode is in charge of 12 symbol intra-segment interleaving, twelve trellis decoders of the same kind are required in the section of the receiver. The twelve trellis decoders can share the branch metric arithmetical unit, ACS arithmetical unit, maximum likelihood value detector and normalization arithmetical unit by using time-division technique because only one symbol is available every twelve symbols that are transferred to the receiver of the twelve trellis decoders.

Each trellis decoder must have all the state metric memory, path memory and traceback unit, which leads to a considerable increase in the size of the hardware of overall trellis decoder. Since the state metric memory comprises memories as many as the number of states, the cost or hardware is not reduced but it may be taken into consideration to curtail the cost of hardware required in the traceback unit including the expensive path memory.

SUMMARY OF THE INVENTION

Accordingly, the present invention is directed to a trellis decoder that substantially obviates one or more of the problems due to limitations and disadvantages of the related art.

An object of the present invention is to provide a traceback device of trellis decoder for ATSC 8VSB (Vestigial Sideband), which is contrived to use the structure of a conventional traceback device employing a single port RAM and complete a traceback as much as a decision depth (L=22) prior to an input path information according to the next symbol data, thereby minimizing the cost for hardware.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a traceback device of a trellis decoder comprises a memory for storing survivor path information as much as a decision, depth, a multiplexing unit for decoding the survivor path information received from the memorizing means, and a traceback unit receiving the survivor path information of lower bits decoded by the multiplexing means and state output of itself, to carry out a state transition and trace back the decoded value of lower bits.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the invention:

DETAILED DESCRIPTION OF PREFERRED EMBODIMENT

Reference will now be made in detail to the preferred embodiments of the present invention, examples of which are illustrated in the accompanying drawings.

Figure 1:
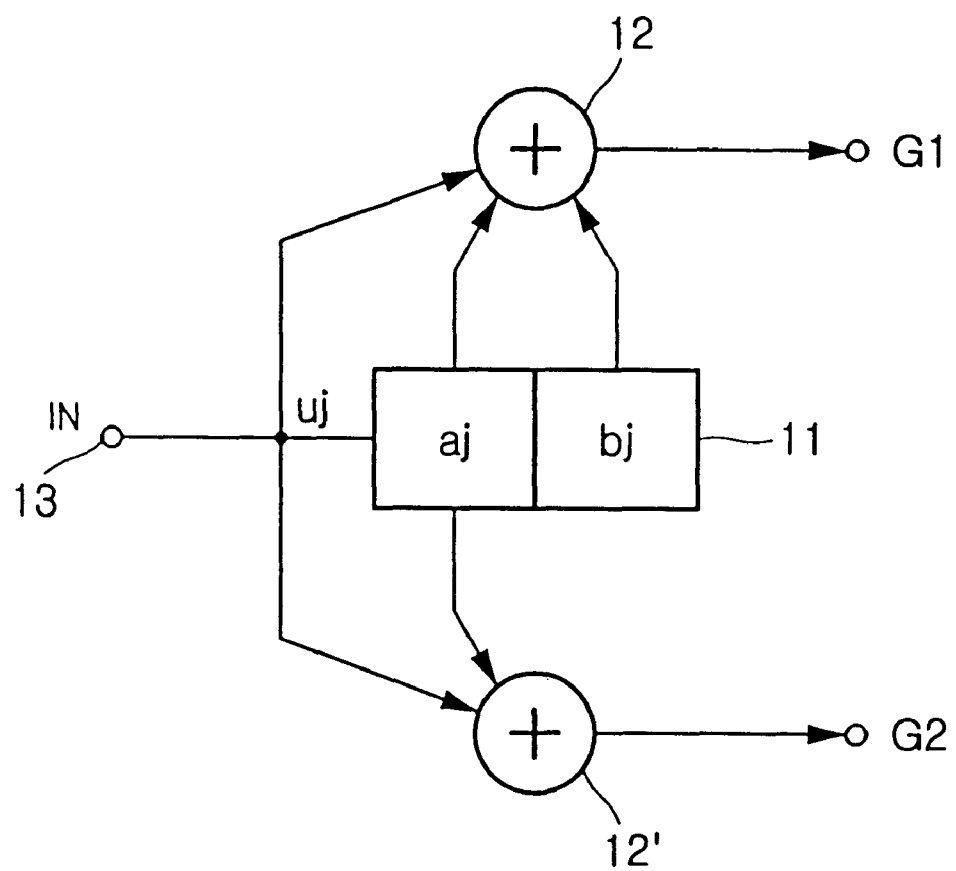
FIG. 1 is a block diagram of a general convolution encoder.
Figure 2:
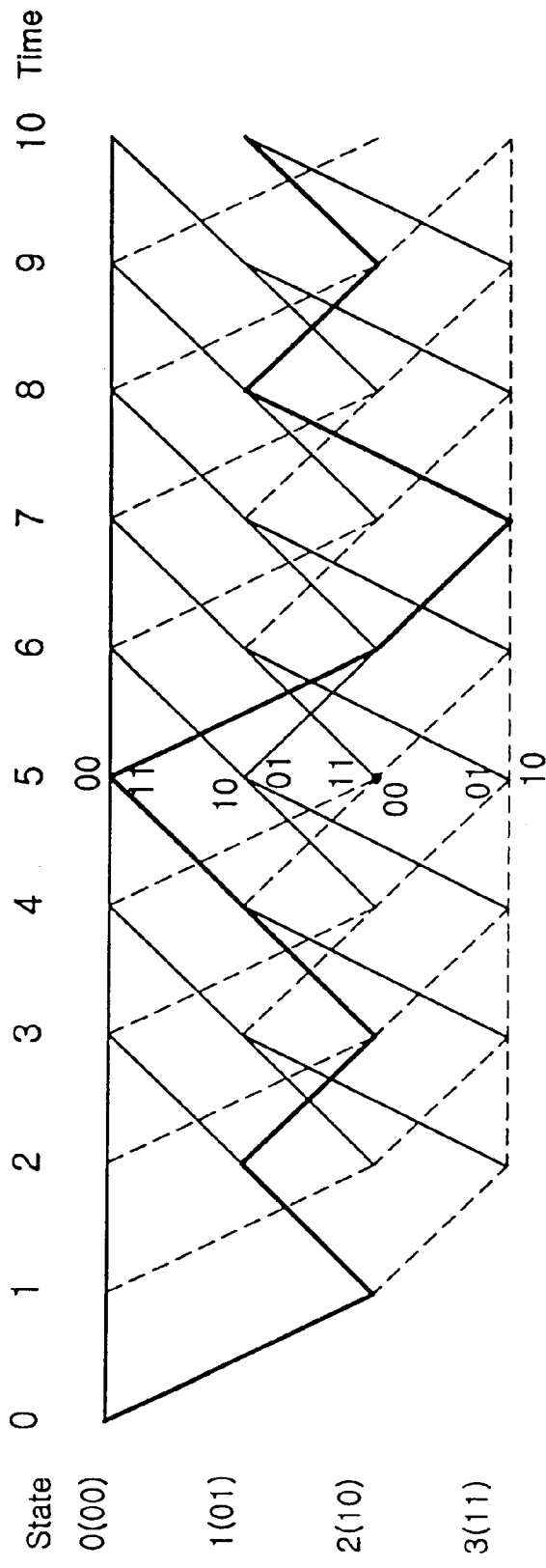
FIG. 2 is a trellis diagram of the output states of the trellis encoder shown in FIG. 1.
Figure 3:
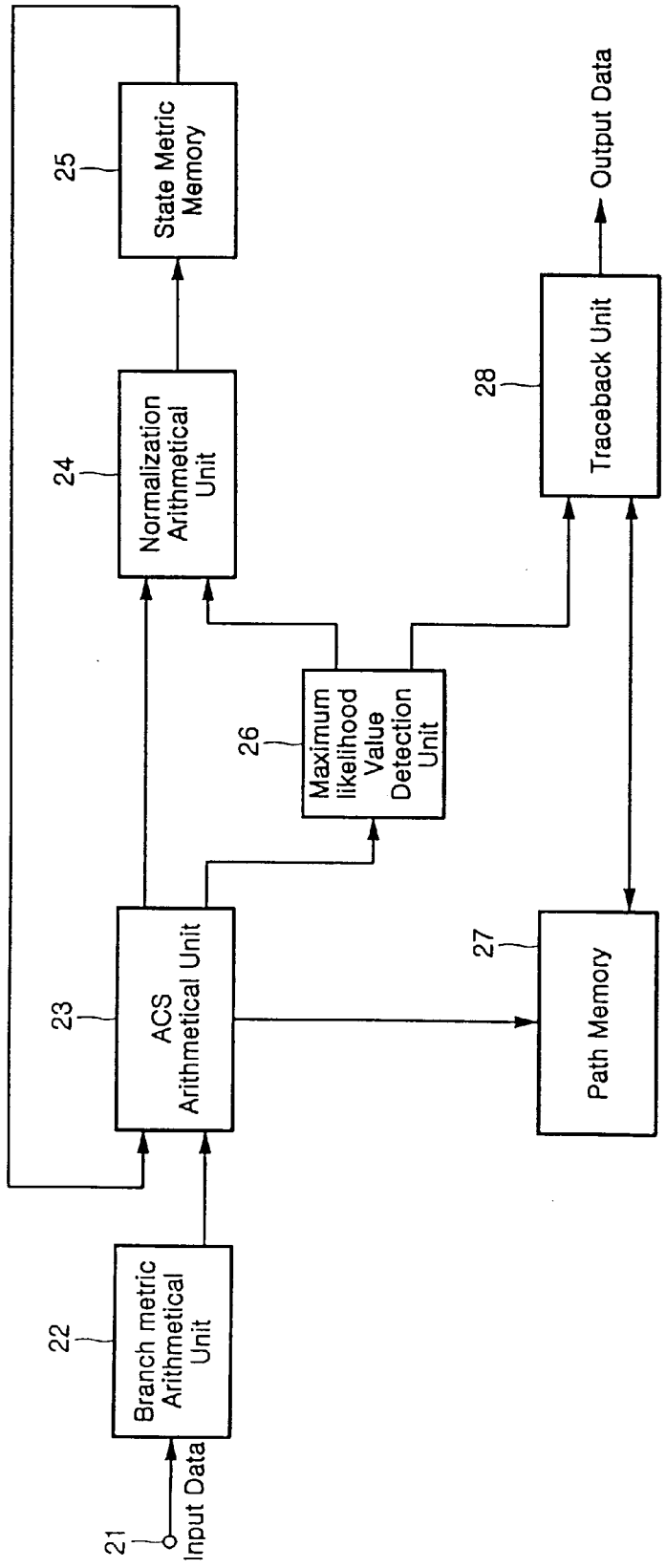
FIG. 3 is a block diagram of a trellis decoder using a general Viterbi decoding algorithm.
Figure 4:
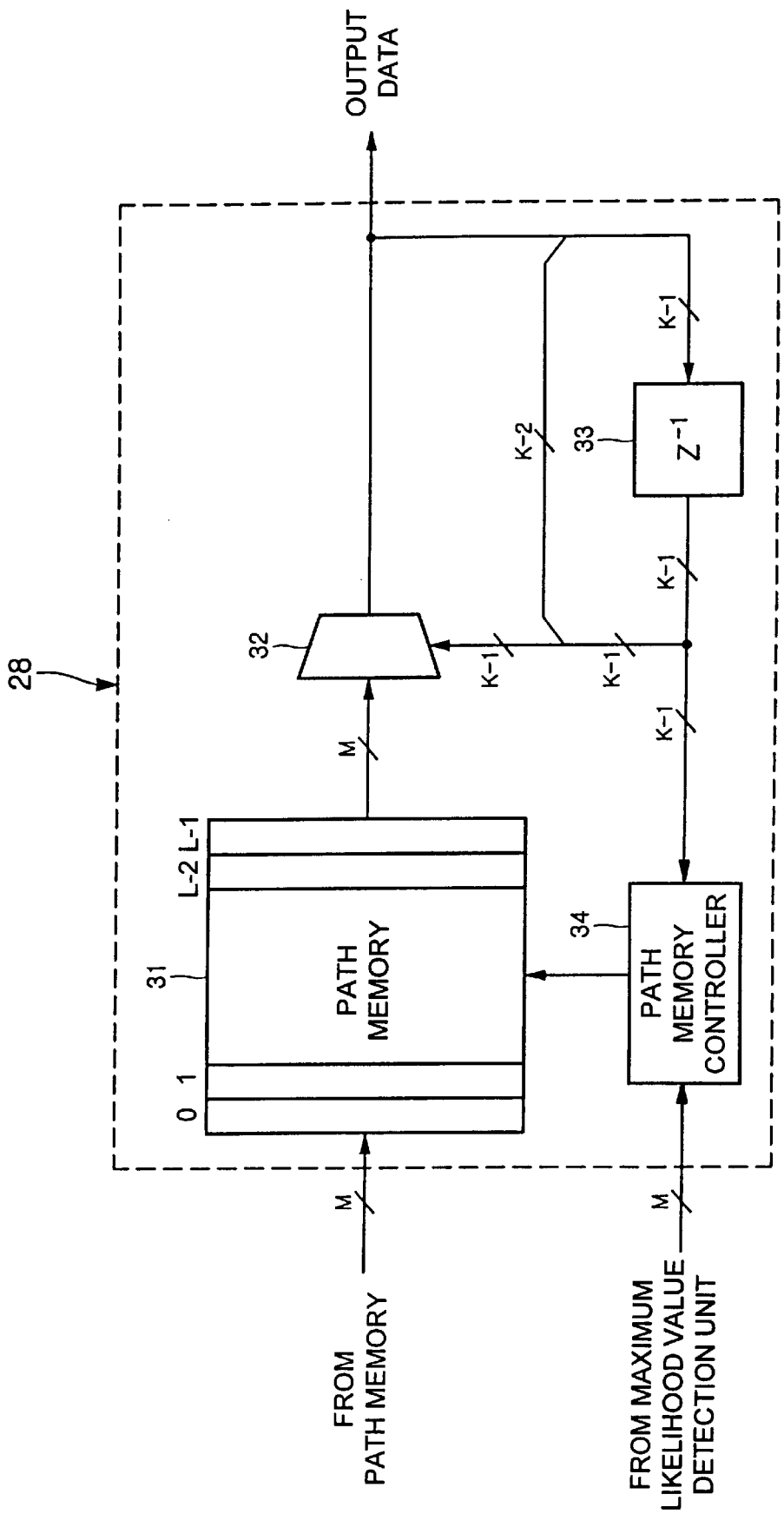
FIG. 4 is a block diagram of an example of the traceback device using RAM.
Figure 5:
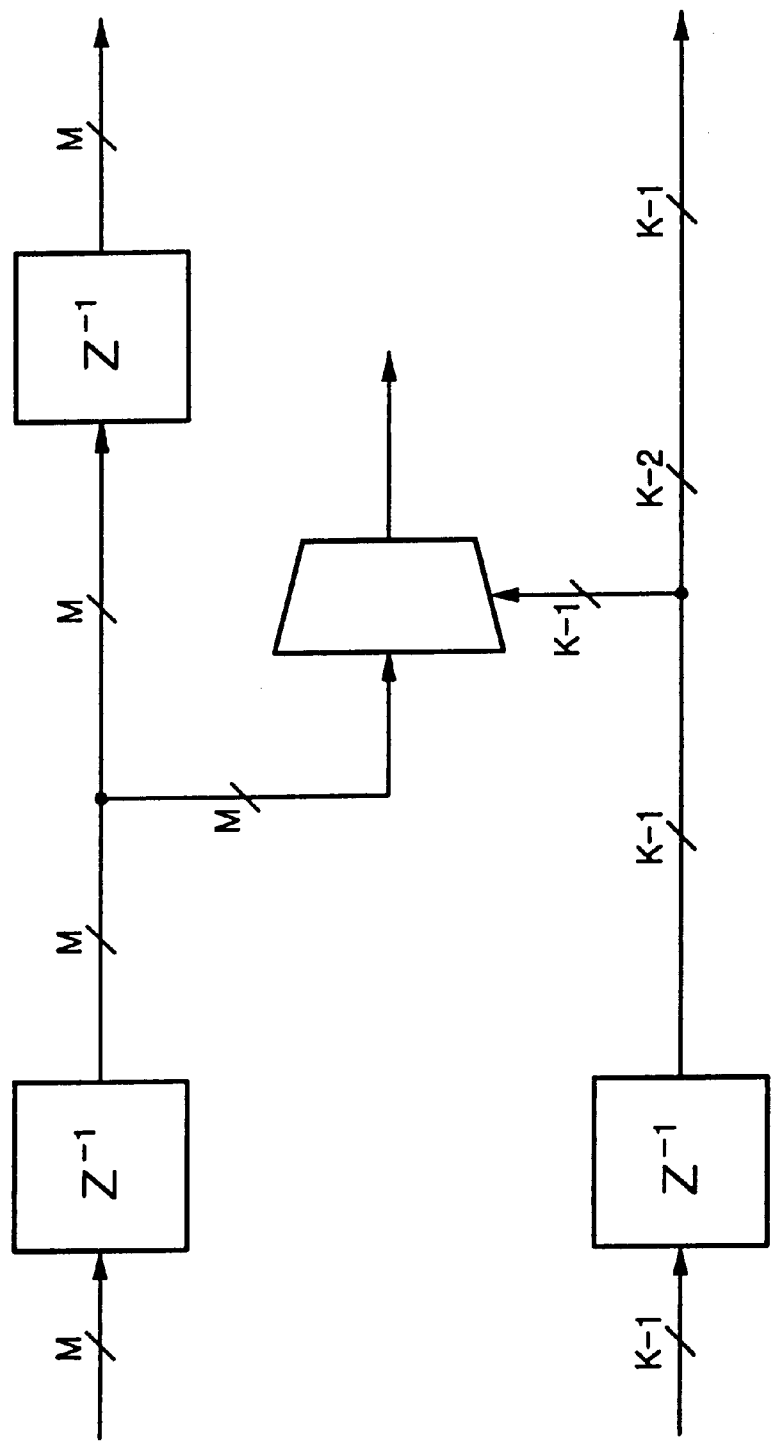
FIG. 5 is a block diagram of another example of the traceback using a multitude of RAMs.
Figure 6:
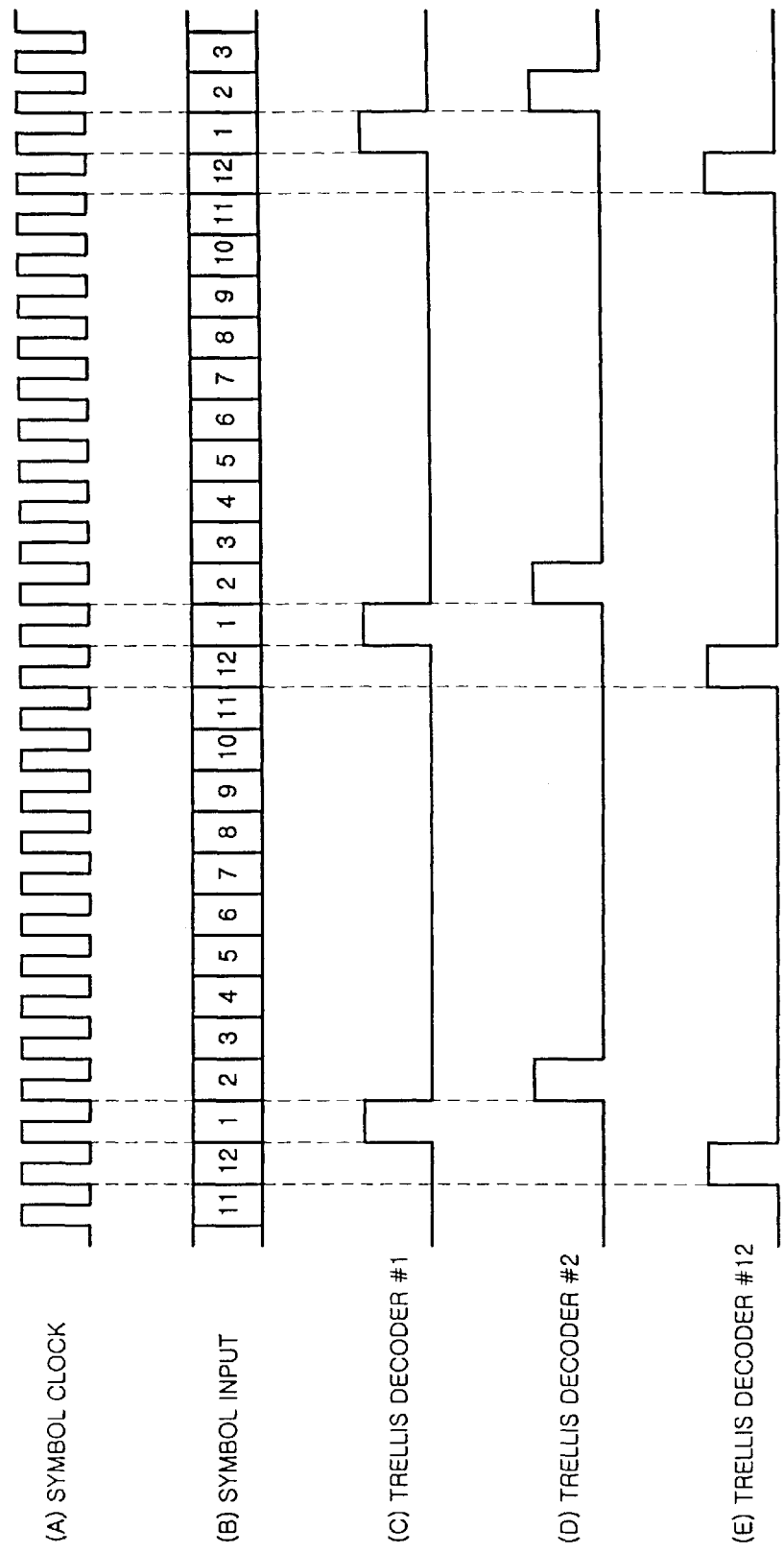
FIG. 6 is a timing diagram of the symbol clock and input of the trellis decoder.
Figure 7:
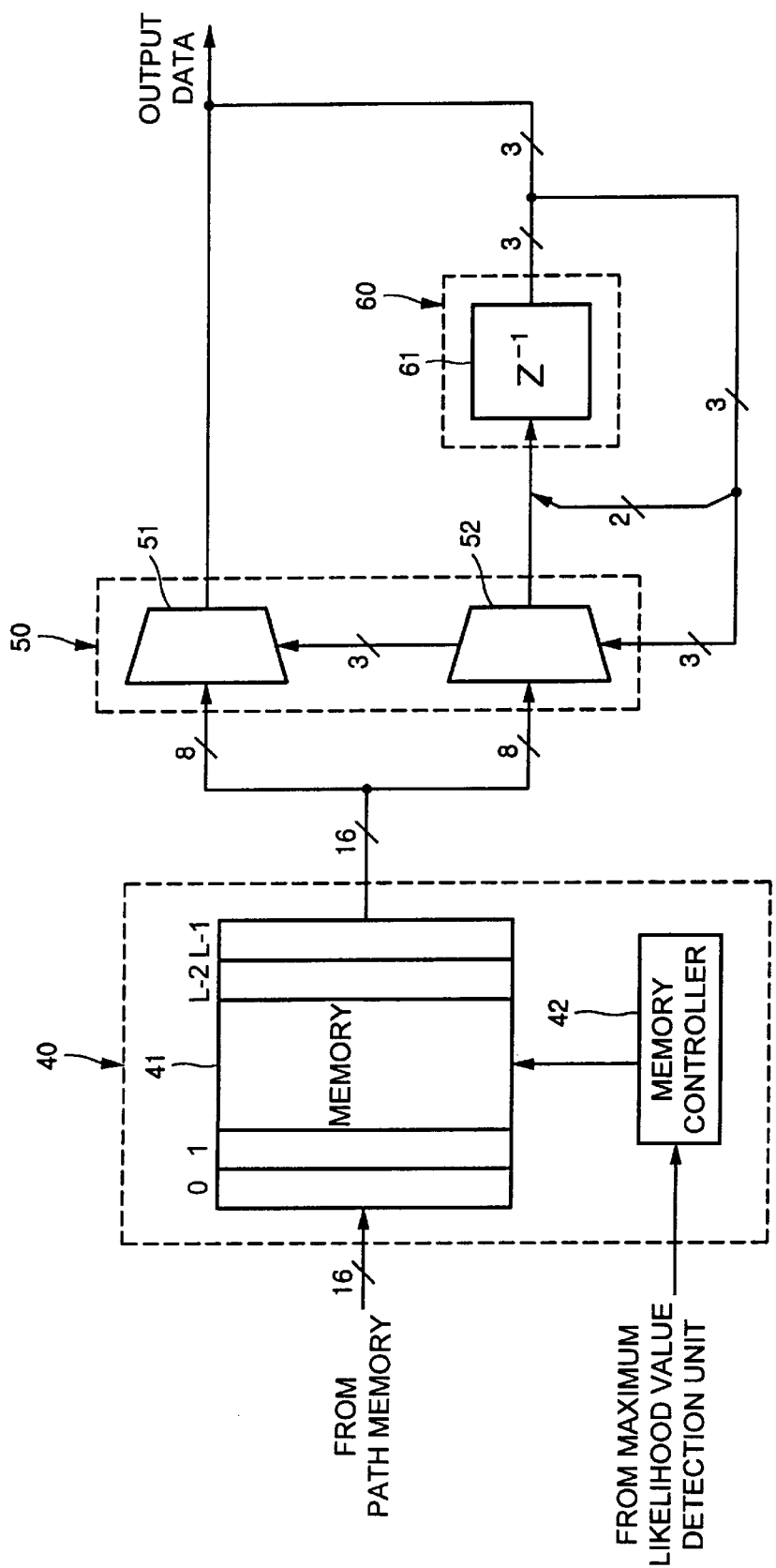
FIG. 7 is a block diagram of the traceback device of a trellis decoder according to the present invention.

FIG. 7 is a block diagram of a traceback device of a trellis decoder for GA 8VSB mode. Referring to FIG. 7, the traceback device comprises a memory 40 for storing survivor path information as much as the decision depth and producing addresses and control signals, a multiplexing unit 50 including two 8-to-1 multiplexers 51 and 52 for extracting 16 bit survivor oath information received from a memory 41 of the memory 40, and a traceback unit 60 receiving the survivor path information of lower bits decoded by the second multiplexer 52 and state output of itself, to carry out a state transition and trace back the decoded value of lower bits.

The memory 40 comprises a memory 41 using a single port RAM of 16*L, and a memory controller 42. The memory controller 42 can generate addresses of 0~21 prior to receiving new path information by using clocks twice the input symbol clock of the trellis decoder.

The multiplexing unit 50 comprises a first multiplexer 51 for multiplexing eight higher bits out of the 16-bit survivor path information from the memory 40, and a second multiplexer 52 for multiplexing eight lower bits out of the 16 bit survivor path information from the memory 40.

The traceback unit 60 comprises a 3-bit register 61 receiving the survivor path information of lower bits decoded by the second multiplexer 52 in the multiplexing unit 50 and state output of itself, to carry out a state transition and trace back the decoded value of lower bits.

The traceback device of the present invention uses the state having the minimum state metric stored in the 3-bit register 61 and the survivor path information stored in the L-1 address of the memory 41. The survivor path information stored in the memory 41 consists of two bits in each state. The higher bit of the two contains the survivor information relating to the higher bit to be encoded, the lower bit being the survivor information relating to the lower bit encoded. The 16-bit survivor information generated from the memory 40 is transferred into the first and second multiplexers 51 and 52 each by eight bits; the first multiplexer 51 receiving eight higher bits comprising the higher bits of the survivor information in each state, the second multiplexer 52 receiving eight lower bits comprising the lower bits of the survivor information in each state. The intact output of the first multiplexer 51 is the decoded signal because the eight higher bits are not encoded by the encoder in the section of the transmitter. The eight lower bits are encoded, transferred to the second multiplexer 52 and decoded through the traceback process.

The outputs of the first and second multiplexers 51 and 52 depend on that of the 3-bit register 61. The input of the 3-bit register 61 is determined by the outputs of the 3-bit register 61 and second multiplexer 52. The first multiplexer 51 and 3-bit register 61 are a kind of state machine to arise the transition of state every clock. Through the transition of state, the traceback process according to the present invention is achieved.

The final state metric determines the decoded output of lower bits. When the 3-bit register 61 comes to the final state through the traceback process, the state metric determines the output of the first multiplexer 51 to be the decoded value of higher bits. The decoded value of lower bits is determined by the combination of the final state metric.

It will be apparent to those skilled in the art that various modifications and variations can be made in the trellis decoder of the present invention without departing from the spirit or scope of the invention. Thus, it is intended that the present invention cover the modifications and variations of this invention provided they come within the scope of the appended claims and their equivalents.

What is claimed is:

1. A traceback device of a trellis decoder, comprising:
   memorizing means for storing survivor path information as much as a decision depth;
   multiplexing means for extracting the survivor path information received from the memorizing means;

said multiplexing means comprising:
- a first multiplexer for multiplexing eight higher bits our of the survivor path information of sixteen bits generated by the memorizing means;
- a second multiplexer for multiplexing eight lower bits out of a survivor path information of sixteen bits generated by the memorizing means; and
- back-tracing means receiving the survivor path information of lower bits from the multiplexing means and state output of itself, to carry out a state transition and trace back the decoded value of lower bits.

2. A traceback device of a trellis decoder, comprising:

memorizing means for storing survivor path information as much as a decision depth;

multiplexing means for extracting the survivor path information received from the memorizing means;

back-tracing means receiving the survivor path information of lower bits from the multiplexing means and state output of itself, to carry out a state transition and trace back the decoded value of lower bits; and said back-tracing means comprising a 3-bit register receiving the survivor path information of lower bits decoded by the multiplexing means and state output of itself, to carry out a state transition and trace back the decoded value of lower bits.

3. A traceback device of a trellis decoder, comprising:

memorizing means for storing survivor path information as much as a decision depth;

multiplexing means for extracting the survivor path information from the memorizing means including first and second multiplexers, wherein the first multiplexer multiplexes higher bits out of the survivor path information generated by the memorizing means and the second multiplexer multiplexes lower bits out of the survivor path information generated by the memorizing means; and back-tracing means receiving the survivor path information of the decoded lower bits from the lower multiplexer of the multiplexing means and state output of itself, to carry out a state transition and trace back the decoded value of lower bits.

\* \* \* \* \*